(12) United States Patent
Go

(10) Patent No.: US 9,276,049 B2
(45) Date of Patent: Mar. 1, 2016

(54) ORGANIC LIGHT-EMITTING DISPLAY APPARATUS

(71) Applicant: SAMSUNG DISPLAY CO., LTD., Yongin, Gyeonggi-Do (KR)

(72) Inventor: Jae-Kyung Go, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/465,744

(22) Filed: Aug. 21, 2014

(65) Prior Publication Data
US 2015/0221707 A1 Aug. 6, 2015

(30) Foreign Application Priority Data

Feb. 5, 2014 (KR) ........................ 10-2014-0013314

(51) Int. Cl.
| | |
|---|---|
| H01L 29/08 | (2006.01) |
| H01L 35/24 | (2006.01) |
| H01L 51/00 | (2006.01) |
| H01L 27/32 | (2006.01) |
| H01L 51/52 | (2006.01) |

(52) U.S. Cl.
CPC ........ *H01L 27/3246* (2013.01); *H01L 51/5206* (2013.01); *H01L 2251/558* (2013.01)

(58) Field of Classification Search
CPC ............ H01L 27/3246; H01L 51/5206; H01L 2251/1558; H01L 2251/558
USPC .......................................................... 257/40
See application file for complete search history.

(56) References Cited

U.S. PATENT DOCUMENTS

| | | | |
|---|---|---|---|
| 6,239,854 B1 | 5/2001 | Hirakata et al. | |
| 2002/0030769 A1 | 3/2002 | Bae | |
| 2005/0024581 A1 | 2/2005 | Kim et al. | |
| 2005/0184927 A1* | 8/2005 | Kwak | 345/45 |
| 2010/0207925 A1 | 8/2010 | Nakanishi | |
| 2012/0267676 A1* | 10/2012 | Satake | 257/99 |
| 2014/0353599 A1* | 12/2014 | Kang | 257/40 |

FOREIGN PATENT DOCUMENTS

| | | |
|---|---|---|
| JP | 2002-110343 | 4/2002 |
| JP | 2002-324662 | 11/2002 |
| JP | 2005-326885 | 11/2005 |
| KR | 10-2005-0082260 | 8/2005 |

* cited by examiner

*Primary Examiner* — Brett Feeney
*Assistant Examiner* — James Chin
(74) *Attorney, Agent, or Firm* — Lewis Roca Rothgerber Christie LLP

(57) ABSTRACT

An organic light-emitting apparatus has a structure capable of reducing defects during the formation of an insulation layer (e.g., a pixel defining layer). The organic light emitting apparatus includes a substrate having a display area and a peripheral area surrounding the display area; a step forming layer on the peripheral area of the substrate; an insulation layer on the substrate across the display area and the peripheral area, wherein the top surface of a portion of the insulation layer corresponding to the step forming layer by covering the step forming layer is higher than the top surface of the remaining portion of the insulation layer; and a first conductive layer on the insulation layer, an end portion of the first conductive layer being close to the portion of the insulation layer corresponding to the step forming layer.

19 Claims, 8 Drawing Sheets

ORGANIC LIGHT-EMITTING DISPLAY APPARATUS

CROSS-REFERENCE TO RELATED APPLICATION

This application claims priority to and the benefit of Korean Patent Application No. 10-2014-0013314, filed on Feb. 5, 2014, in the Korean Intellectual Property Office, the disclosure of which is incorporated herein in its entirety by reference.

BACKGROUND

1. Field

One or more embodiments of the present invention relate to an organic light-emitting display apparatus.

2. Description of the Related Art

Generally, an organic light-emitting display apparatus includes a plurality of organic light-emitting devices, each of which includes a pixel electrode, a counter electrode, and an intermediate layer that is interposed between the pixel electrode and the counter electrode. The intermediate layer includes an emission layer. In such an organic light-emitting display apparatus, the pixel electrodes are arranged apart from one another, whereas the counter electrode is formed as a single body with respect to the plurality of organic light-emitting devices. Furthermore, the counter electrode contacts an electrode power supply line outside a display area, and receives a preset electric signal.

However, in the manufacturing process of such a comparable organic light-emitting display apparatus, after the electrode power supply line has been formed, and when a material for forming an insulation layer (e.g., a pixel defining layer) is applied thereon to form the insulation layer, the material for forming the insulation layer may not be smoothly applied due to the electrode power supply line underneath.

SUMMARY

Aspects according to one or more embodiments of the present invention are directed toward an organic light-emitting apparatus having a structure capable of reducing defects during the formation of an insulation layer (e.g., a pixel defining layer).

Additional aspects will be set forth in part in the description which follows and, in part, will be apparent from the description, or may be learned by practice of the presented embodiments.

According to one or more embodiments of the present invention, an organic light emitting display apparatus includes a substrate having a display area and a peripheral area surrounding the display area; a step forming layer on the peripheral area of the substrate; an insulation layer on the substrate and over the display area and the peripheral area, wherein a top surface of a portion of the insulation layer corresponding to the step forming layer by covering the step forming layer is higher than a top surface of a remaining portion of the insulation layer; and a first conductive layer on the remaining portion of the insulation layer, an end portion of the first conductive layer being close to the portion of the insulation layer corresponding to the step forming layer.

A distance between a top surface of the substrate and a top surface of the end portion of the first conductive layer may be smaller than or equal to a distance between the top surface of the substrate and a top surface of the portion of the insulation layer corresponding to the step forming layer, the end portion of the first conductive layer being a portion of the first conductive layer toward an edge of the substrate. The first conductive layer has a multi-layer structure, and an etch rate of a material constituting a layer below the topmost layer may be higher than an etch rate of a material constituting the topmost layer.

The first conductive layer may include a first titanium layer, an aluminum layer on the first titanium layer, and a second titanium layer on the aluminum layer.

A distance between a top surface of the substrate and a top surface of the end portion of the first conductive layer may be identical to a distance between the top surface of the substrate and a top surface of the portion of the insulation layer corresponding to the step forming layer, the end portion of the first conductive layer being a portion of the first conductive layer toward an edge of the substrate.

A thickness of the step forming layer may be equal to or greater than a thickness of the first conductive layer.

The step forming layer may include a first step forming layer and a second step forming layer.

A side surface of the end portion of the first conductive layer facing toward the step forming layer may contact the insulation layer.

The insulation layer may include a groove or a hole corresponding to the end portion of the first conductive layer, and the end portion of the first conductive layer may be located in the groove or the hole of the insulation layer.

The organic light emitting display apparatus may further include a second conductive layer between the substrate and the insulation layer and at least partially exposed by the groove or the hole of the insulation layer, wherein the end portion of the first conductive layer may contact the second conductive layer. Furthermore, the second conductive layer may extend to below the step forming layer.

The step forming layer may have a shape extending along an edge side of the substrate, and the first conductive layer may also have a shape extending along the edge side of the substrate. The substrate may have a rectangular shape having long sides and short sides, and the edge side of the substrate may be the long side.

The step forming layer may be formed at a plurality of locations along an edge side of the substrate, and the first conductive layer may have a shape extending along the edge side of the substrate. Furthermore, the substrate may have a rectangular shape having long sides and short sides, and the edge side of the substrate may be the long side.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
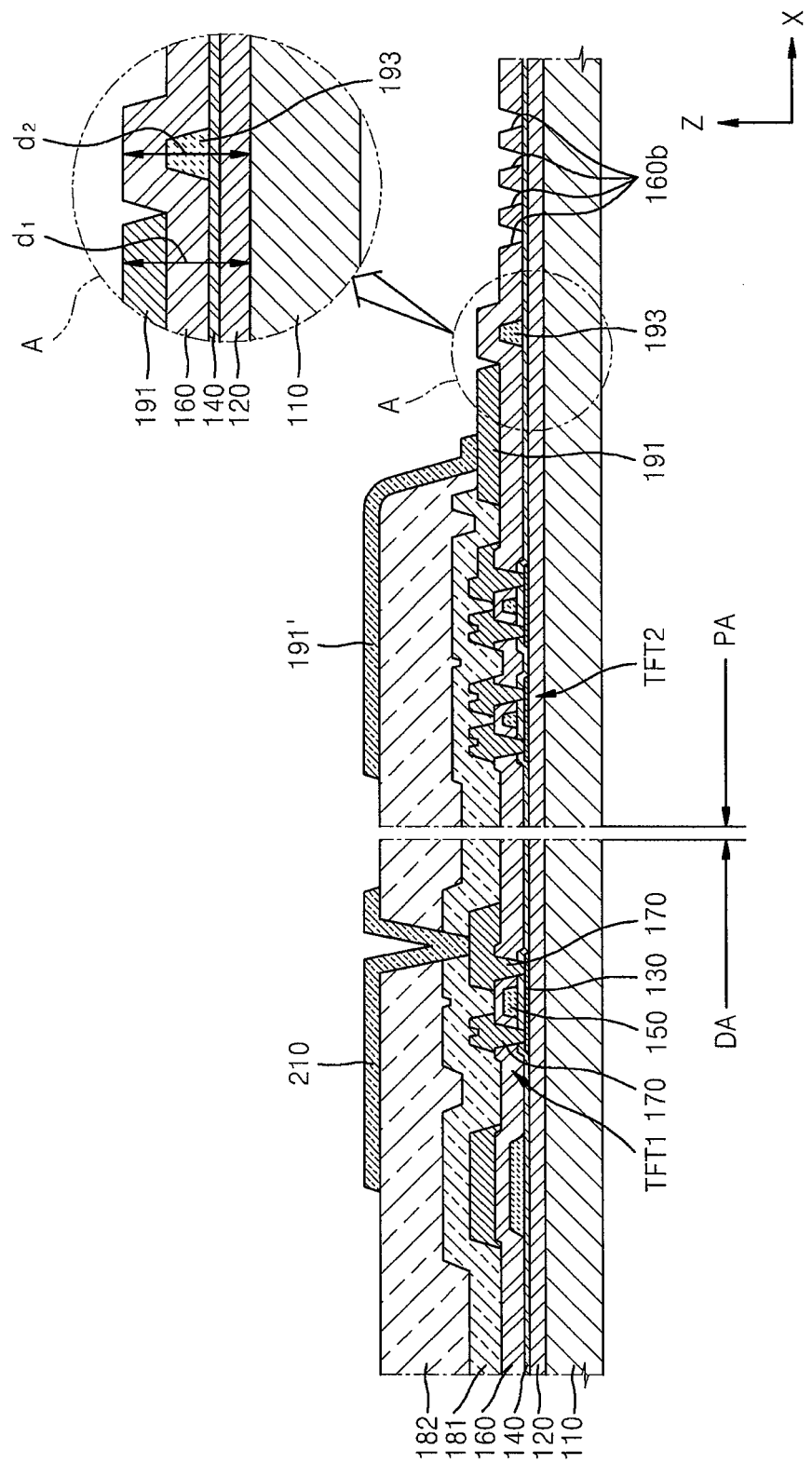
FIG. 1 is a schematic sectional view of a portion of an organic light emitting display apparatus according to an embodiment of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Further, the use of "may" when describing embodiments of the present invention refers to "one or more embodiments of the present invention."

It will be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto. Further, when a first element is described as being "coupled" or "connected" to a second element, the first element can be directly coupled or connected to the second element; or the first element can be indirectly coupled or connected to the second element with one or more intervening elements interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic sectional view of a portion of an organic light emitting display apparatus according to an embodiment of the present invention.

The organic light-emitting display apparatus according to an embodiment of the present invention includes a substrate 110 including a display area DA and a peripheral area PA, which is a non-display area outside the display area DA. The substrate 110 may be formed of any of various suitable materials, such as a glass material, a metal, or a plastic material. A plurality of thin-film transistors TFT1 are arranged at the display area DA of the substrate 110, where organic light emitting devices electrically coupled (e.g., connected) to the plurality of thin-film transistors TFT1 may be arranged. The electric coupling or connection of the organic light-emitting devices to the plurality of thin-film transistors TFT1 may be understood as the electric coupling or connection of a plurality of pixel electrodes 210 to the plurality of thin-film transistors TFT1. If desired, a thin-film transistor TFT2 may be arranged at the peripheral area PA of the substrate 110. The thin-film transistor TFT2 may be a part of a circuit unit for controlling electric signals applied into the display area DA.

The thin-film transistor TFT1 or the thin-film transistor TFT2 may include a semiconductor layer 130 including an amorphous silicon, a polycrystalline silicon, or an organic semiconductor material; a gate electrode 150; and source electrode/drain electrode 170. A buffer layer 120, which is formed of silicon oxide or silicon nitride for planarizing the top surface of the substrate 110, and/or for reducing or preventing permeation of impurities into the semiconductor layer 130, is located on the substrate 110. The semiconductor layer 130 may be located on the buffer layer 120.

The gate electrode 150 is located on the semiconductor layer 130, where the source electrode 170 and the drain electrode 170 electrically communicate with each other according to a signal applied to the gate electrode 150. In consideration of adhesiveness with respect to an adjacent layer, a surface planarity of a surface on which the gate electrode 150 is stacked, and the processibility, the gate electrode 150 may be formed as a single layer or multiple layers containing one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). Here, to secure insulation between the semiconductor layer 130 and the gate electrode 150, a gate insulation layer 140 formed of silicon oxide and/or silicon nitride may be interposed between the semiconductor layer 130 and the gate electrode 150.

An interlayer insulation layer 160 may be located on the gate electrode 150, where the interlayer insulation layer 160 may be formed as a single layer or multiple layers containing silicon oxide and/or silicon nitride.

The source electrode/drain electrode 170 are arranged on the interlayer insulation layer 160. The source electrode/drain electrode 170 are electrically coupled to the semiconductor layer 130 via contact holes respectively formed in the interlayer insulation layer 160 and the gate insulation layer 140. In consideration of the conductivity, the source electrode/drain electrode 170 may be formed as a single layer or multiple layers containing one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example.

To protect the thin-film transistor TFT1 having the structure as described above, a protection layer 181 may be disposed to cover the thin-film transistor TFT1. The protection layer 181 may be formed of an inorganic material, such as silicon oxide, silicon nitride, or silicon oxynitride. Although FIG. 1 shows that the protection layer 181 has a single layer structure, various suitable modifications may be made therein. For example, the protection layer 181 may have a multi-layer structure.

A planarizing layer 182 may be located on the protection layer 181, if desired. For example, if the organic light-emitting device (represented by the pixel electrode 210) is located on the thin-film transistor TFT1 as shown in FIG. 1, the planarizing layer 182 may have a flat top surface, such that the pixel electrode 210 is formed flat. The planarizing layer 182 may be formed of, for example, an acryl-based organic material or benzocyclobutene (BCB). Although FIG. 1 shows that the planarizing layer 182 has a single layer structure, various suitable modifications, e.g., a multi-layer structure, may be made therein.

If desired, the protection layer 181 may be omitted, the planarizing layer 182 may be omitted, or the protection layer

181 and the planarizing layer 182 may be integrated as a single body (e.g., a single layer).

In the display area DA of the substrate 110, the organic light-emitting device, which includes the pixel electrode 210; a counter electrode; and an intermediate layer that is interposed between the pixel electrode 210 and the counter electrode and includes an emission layer, is located on the planarizing layer 182. In FIG. 1, only the pixel electrode 210 is shown for convenience of explanation.

Openings for exposing at least one from between the source electrode/drain electrode 170 of the thin-film transistor TFT1 are formed in the protection layer 181 and the planarizing layer 182. The pixel electrode 210, which is electrically coupled to the thin-film transistor TFT1 by contacting one from between the source electrode/drain electrode 170 via the openings, is located on the planarizing layer 182. The pixel electrode 210 may be formed as a transparent electrode, a semi-transparent electrode or a reflective electrode. If the pixel electrode 210 is formed as a transparent electrode or a semi-transparent electrode, the pixel electrode 210 may be formed of, for example, ITO, IZO, ZnO, $In_2O_3$, IGO, or AZO. If the pixel electrode 210 is formed as a reflective electrode, the pixel electrode 210 may have a reflective layer formed of Ag, Mg, Al, Pt, Pd, Au, Ni, Nd, Ir, Cr, or a compound thereof; and a layer (i.e., another layer) formed of ITO, IZO, ZnO, $In_2O_3$, IGO, or AZO. However, the present invention is not limited thereto, and the pixel electrode 210 may be formed of any of various other suitable materials, and may be formed as a single layer or multiple layers.

The intermediate layer of the organic light-emitting device may contain a monomer material (e.g., a low molecular weight material) or a polymer material. If the intermediate layer contains a monomer material, the intermediate layer may include a hole injection layer (HIL), a hole transport layer (HTL), an emission layer (EML), an electron transport layer (ETL), and an electron injection layer (EIL). If the intermediate layer contains a polymer material, the intermediate layer may generally have a structure including an HTL and an EML. However, the present invention is not limited thereto, and the intermediate layer may have any of various other suitable structures.

The counter electrode may be formed on the display area DA to cover the display area DA. In other words, the counter electrode may be formed as a single body with respect to the plurality of organic light-emitting devices, and may correspond to the plurality of pixel electrodes 210. The counter electrode may be located across (or over) the display area DA and the peripheral area PA of the substrate 110. The counter electrode may be formed as a transparent electrode, a semi-transparent electrode or a reflective electrode. If the counter electrode is formed as a transparent electrode or a semi-transparent electrode, the counter electrode may include a layer formed of a metal with a small work function, e.g., Li, Ca, LiF/Ca, LiF/Al, Al, Ag, Mg, or a compound thereof; and a conductive or semi-conductive layer formed of ITO, IZO, ZnO, or $In_2O_3$. If the counter electrode is formed as a reflective electrode, the counter electrode may include a layer formed of Li, Ca, LiF/Ca, LiF/Al, Al, Ag, Mg, or a compound thereof. However, the present invention is not limited thereto, and various suitable modifications may be made in materials and structures of the counter electrode.

Meanwhile, an electrode power supply line 191 and a connection line 191' contacting the electrode power supply line 191 are arranged in the peripheral area PA outside the display area DA of the substrate 110. The counter electrode is located across (or over) the display area DA and the peripheral area PA of the substrate 110, and contacts the electrode power supply line 191 and/or the connection line 191' of the peripheral area PA. As a result, the counter electrode may receive an electrode power, that is, an electric signal from the electrode power supply line 191.

The electrode power supply line 191 may be located in the peripheral area PA of the substrate 110 at a location that is close to the display area DA of the substrate 110. As shown in FIG. 1, the electrode power supply line 191 may be concurrently (e.g., simultaneously) formed of the same material as the thin-film transistors (e.g., the same material as the source electrodes/drain electrodes 170 of the thin-film transistor TFT1 and the thin-film transistor TFT2). Therefore, like the source electrode/drain electrode 170, the electrode power supply line 191 may be located on the interlayer insulation layer 160.

The interlayer insulation layer 160 is located across (or over) the display area DA and the peripheral area PA of the substrate 110 as shown in FIG. 1. Here, in the peripheral area PA of the substrate 110, a step forming layer 193 is interposed between the substrate 110 and the interlayer insulation layer 160. Therefore, the top surface of the portion of the interlayer insulation layer 160 corresponding to the step forming layer 193 is farther away from the substrate 110 than the top surface of the remaining portion of the interlayer insulation layer 160. In other words, the top surface of the portion of the interlayer insulation layer 160 corresponding to the step forming layer 193 is higher than the top surface of the remaining portion of the interlayer insulation layer 160. The step forming layer 193 may be concurrently (e.g., simultaneously) formed of the same material as the gate electrode 150 of the thin-film transistors TFT1 and TFT2. If desired, the step forming layer 193 may be formed to be thicker than the gate electrode 150.

Furthermore, the electrode power supply line 191 is located on the remaining portion of the interlayer insulation layer 160, where an end portion of the electrode power supply line 191 is close to the portion of the interlayer insulation layer 160 corresponding to the step forming layer 193. Here, the end portion of the electrode power supply line 191 may be understood as one end portion of the electrode power supply line 191 in a direction toward an edge of the substrate 110, i.e., a direction (+x direction) opposite to the direction toward the display area DA. Therefore, as shown in the portion A of FIG. 1, a distance $d_1$ between the top surface of the substrate 110 and the top surface of the end portion of the electrode power supply line 191, the portion toward an edge of the substrate 110 (+x direction), may be smaller than or equal to a distance $d_2$ between the top surface of the substrate 110 and the top surface of the portion of the interlayer insulation layer 160 corresponding to the step forming layer 193. FIG. 1 shows a case in which the thickness of the step forming layer 193 is almost identical to (e.g., substantially the same as) the thickness of the electrode power supply line 191, and the distance $d_1$ is identical to (or substantially the same as) the distance $d_2$.

As described above, as the distance $d_1$ between the top surface of the substrate 110 and the top surface of a portion of the end portion of the electrode power supply line 191, the portion toward an edge of the substrate 110 (+x direction), becomes smaller than or equal to a distance $d_2$ between the top surface of the substrate 110 and the top surface of the portion of the interlayer insulation layer 160 corresponding to the step forming layer 193, and as the end portion of the electrode power supply line 191 is located close to the portion of the interlayer insulation layer 160 corresponding to the step forming layer 193, a side surface (e.g., an end side surface) of the end portion of the electrode power supply line 191 may not be exposed to the outside or, even if exposed to the outside, effects due to the exposure may be reduced or minimized.

As described above, in a comparable technology, the electrode power supply line 191 may be concurrently (e.g., simultaneously) formed of the same material as the source electrode/drain electrode 170 of the thin-film transistors TFT1 and TFT2, where the electrode power supply line 191 may have a multi-layer structure and the etch rate of the material constituting the topmost layer may be smaller (or lower) than the etch rate of the material constituting a layer therebelow. Therefore, the corresponding layer (below the topmost layer) may be damaged during formation of the electrode power supply line 191 or an operation thereafter. However, in an organic light-emitting apparatus according to the present embodiment, such damage to a layer may be effectively prevented or reduced.

Figure 2:
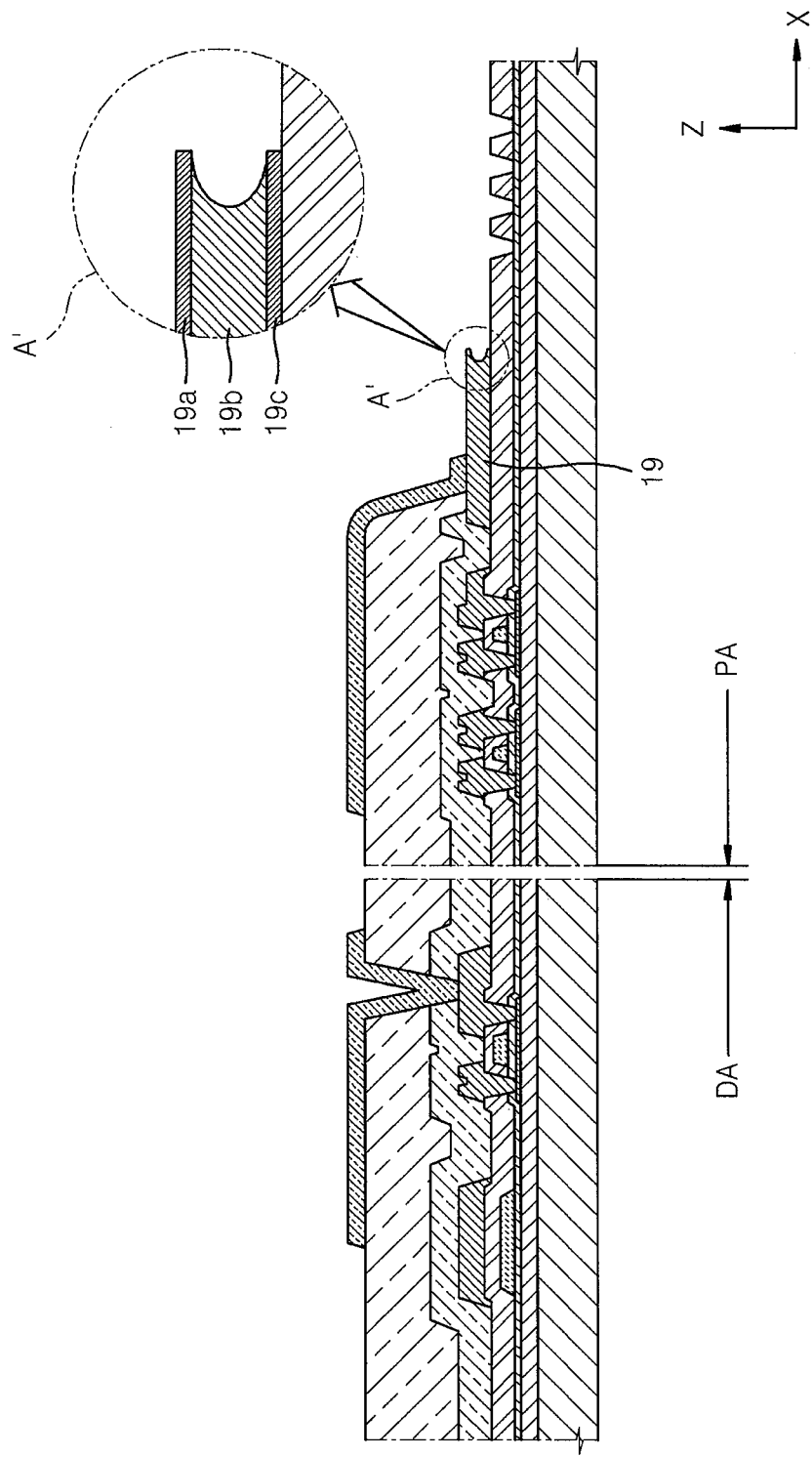
FIGS. 2 and 3 are schematic cross-sectional views of a portion of an organic light-emitting apparatus according to a comparative embodiment.
Figure 3:
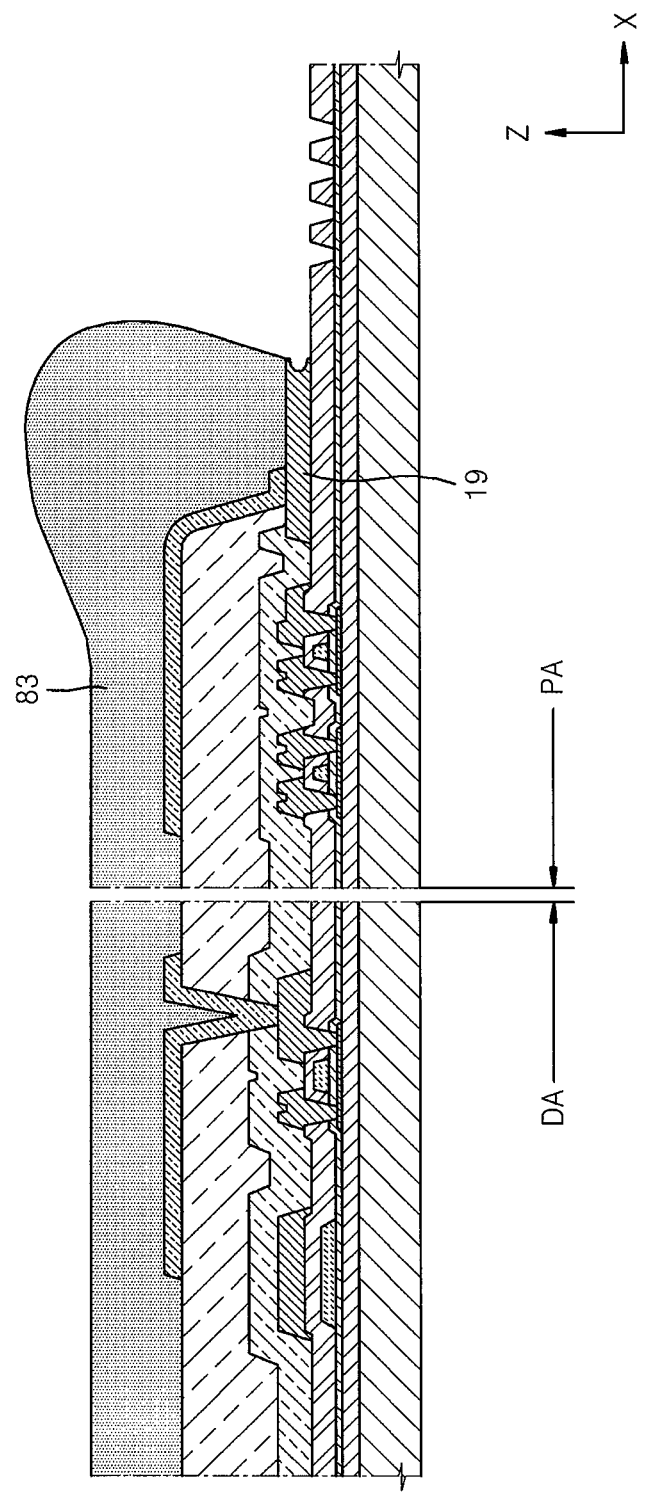

FIGS. 2 and 3 are schematic cross-sectional views of a portion of an organic light-emitting apparatus according to a comparative embodiment. As shown in FIG. 2, the electrode power supply line 19 includes a first Ti layer 19c, an Al layer 19b on the first Ti layer 19c, and a second Ti layer 19a on the Al layer 19b. The etch rate of the Al layer 19b is higher than that of the second Ti layer 19a.

Here, if there is no groove or hole formed in an interlayer insulation layer as shown in FIG. 2, and an end side surface of an end portion of the electrode power supply line 19 is not covered by the interlayer insulation layer and is exposed to the outside, the Al layer 19b may be etched more than the second Ti layer 19a during the formation of the electrode power supply line 19 or other operations. Since the top surface of the Al layer 19b is covered by the second Ti layer 19a, the top surface of the Al layer 19b is not damaged. However, as shown in the portion A' of FIG. 2, an end portion of the Al layer 19b is exposed to the outside, and thus the corresponding portion is etched. As a result, the end side surface of the end portion of the electrode power supply line 19 has an inwardly concave shape.

After a pixel electrode is formed, a pixel defining layer having an opening for exposing the center portion of the pixel electrode is formed. To this end, as shown in FIG. 3, a material for forming the pixel defining layer, which is an organic material such as polyimide, is applied onto a planarizing layer and the pixel electrode. The material for forming the pixel defining layer is applied onto the planarizing layer and the pixel electrode by moving a nozzle for ejecting the same in a direction from the left to the right of FIG. 3 (+x direction). Here, as shown in FIGS. 2 and 3, if the end side surface of the end portion of the electrode power supply line 19 has an inwardly concave shape, the material for forming the pixel defining layer does not spread toward an edge of the substrate (+x direction) at the end of the end portion of the electrode power supply line 19 and is collected thereat, as shown in FIG. 3. As a result, there is a problem in forming the pixel defining layer with a uniform thickness. Furthermore, in case of concurrently (e.g., simultaneously) fabricating a plurality of organic light-emitting apparatuses by using (utilizing) a single large-sized mother glass, the material for forming the pixel defining layer may not spread smoothly from one organic light-emitting apparatus to another organic light-emitting apparatus.

However, in case of an organic light-emitting apparatus according to the present embodiment, the distance $d_1$ between the top surface of the substrate 110 and the top surface of the end portion of the electrode power supply line 191, the portion toward an edge of the substrate 110 (+x direction), becomes smaller than or equal to the distance $d_2$ between the top surface of the substrate 110 and the top surface of the portion of the interlayer insulation layer 160 corresponding to the step forming layer 193. Furthermore, the end portion of the electrode power supply line 191 is located close to the portion of the interlayer insulation layer 160 corresponding to the step forming layer 193. Therefore, during application of the material for forming the pixel defining layer, even if the material for forming the pixel defining layer does not spread and is temporarily collected at the end portion of the electrode power supply line 191, the portion toward an edge of the substrate 110 (+x direction), the collected material for forming the pixel defining layer contacts the top surface of the portion of the interlayer insulation layer 160 corresponding to the step forming layer 193 that is close to the end portion of the electrode power supply line 191. Once the material for forming the pixel defining layer contacts the top surface of the portion of the interlayer insulation layer 160 corresponding to the step forming layer 193, the material for forming the pixel defining layer does not stay on the electrode power supply line 191, spreads along the interlayer insulation layer 160, and is applied onto the interlayer insulation layer 160. Therefore, in case of an organic light emitting display apparatus according to the present embodiment, the material for forming the pixel defining layer may be applied onto the display area DA and the peripheral area PA to a uniform thickness during the manufacturing of the organic light emitting display apparatus.

Figure 4:
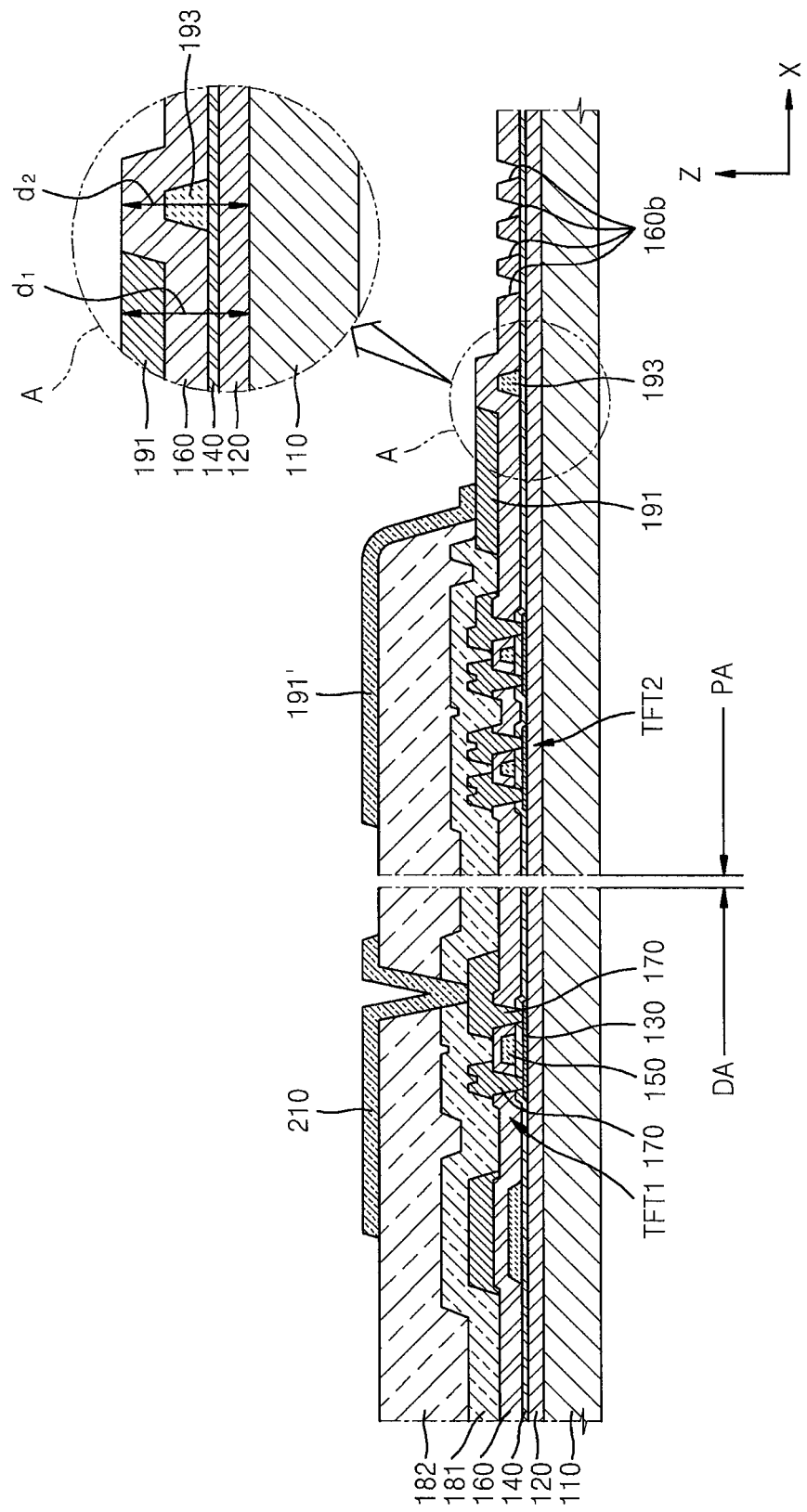
FIG. 4 is a schematic sectional view of a portion of an organic light emitting display apparatus according to another embodiment of the present invention.

FIG. 4 is a schematic sectional view of a portion of an organic light emitting display apparatus according to another embodiment of the present invention. As shown in FIG. 4, in the organic light emitting display apparatus according to the present embodiment, the distance $d_1$ between the top surface of the substrate 110 and the top surface of the end portion of the electrode power supply line 191, the portion toward an edge of the substrate 110 (+x direction), may be smaller than or equal to the distance $d_2$ between the top surface of the substrate 110 and the top surface of the portion of the interlayer insulation layer 160 corresponding to the step forming layer 193. FIG. 4 shows a case in which the distance $d_1$ is identical to the distance $d_2$. Furthermore, in case of the organic light emitting display apparatus according to the present embodiment, the side surface (e.g., the end side surface) of the end portion of the electrode power supply line 191, that is, the side surface (e.g., the end side surface) of the end portion of the electrode power supply line 191 facing toward the step forming layer 193, contacts the interlayer insulation layer 160.

In other words, the side surface (e.g., the end side surface) of the end portion of the electrode power supply line 191 facing toward the step forming layer 193 contacts a portion of the surface of the interlayer insulation layer 160 interconnecting the top surface of the portion of the interlayer insulation layer 160 corresponding to the step forming layer 193 and the top surface of the remaining portion of the interlayer insulation layer 160. Therefore, the side surface (e.g., the end side surface) of the end portion of the electrode power supply line 191 may not be exposed to the outside or may be exposed to the minimum. As described above, the side surface (e.g., the end side surface) of the end portion of the electrode power supply line 191 is covered by the interlayer insulation layer 160, and thus the side surface (e.g., the end side surface) of the end portion of the electrode power supply line 191 may not be exposed to the outside or may be exposed to the minimum. As a result, damages to the side surface (e.g., the end side surface) of the end portion of the electrode power supply line 191 may be prevented or reduced (e.g., minimized), and thus the material for forming the pixel defining layer may be applied onto the display area DA and the peripheral area PA to a uniform thickness.

Figure 5:
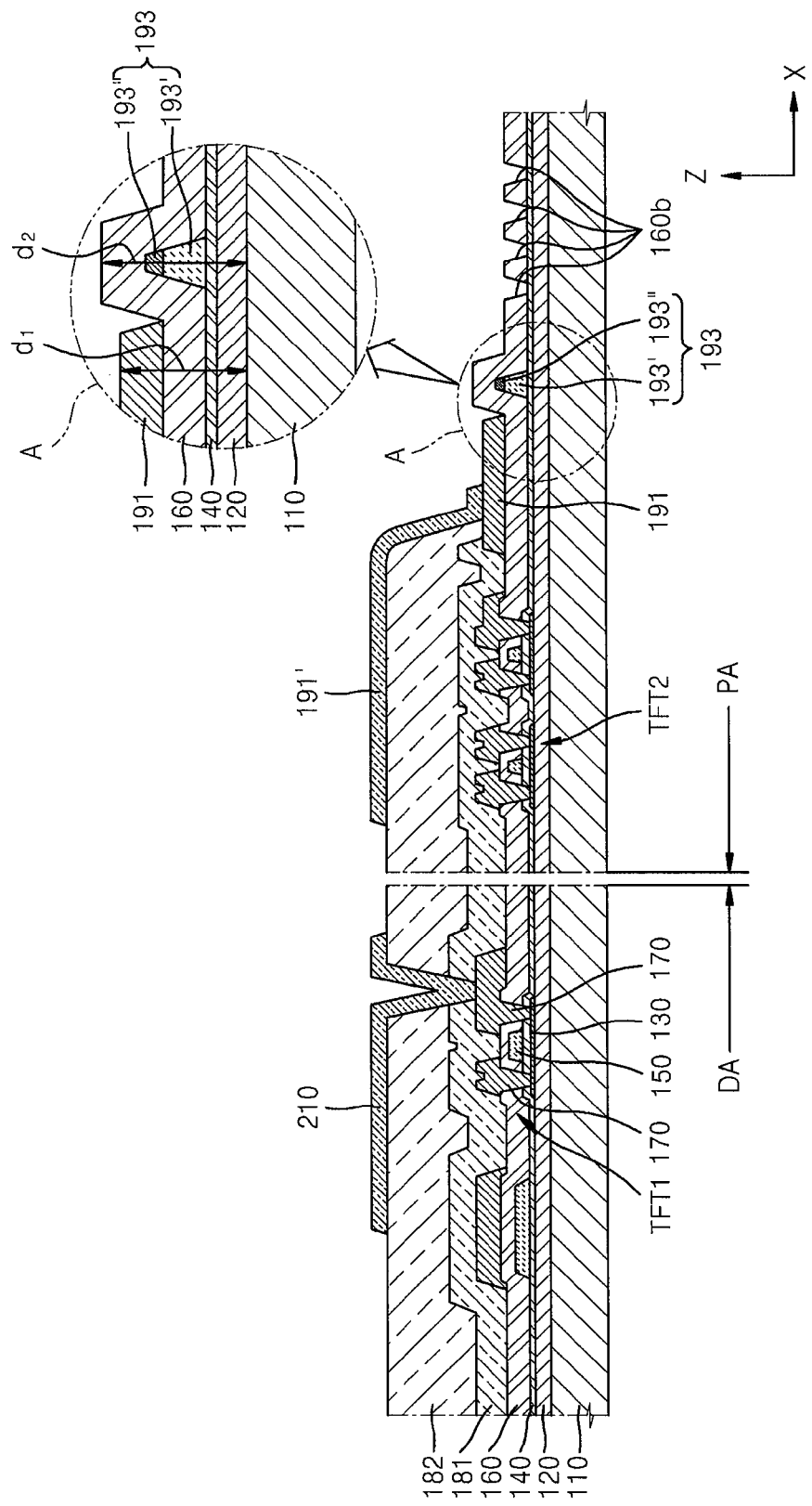
FIG. 5 is a schematic sectional view of a portion of an organic light-emitting apparatus according to another embodiment of the present invention.

FIG. 5 is a schematic sectional view of a portion of an organic light-emitting apparatus according to another embodiment of the present invention. As shown in FIG. 5, an organic light emitting display apparatus according to the present embodiment includes the step forming layer 193, wherein the step forming layer 193 includes a first step forming layer 193' and a second step forming layer 193". As described above, the step forming layer 193 may have a multi-layer structure to have a suitable thickness (height). By forming the step forming layer 193 to have a thickness equal to or greater than the electrode power supply line 191 by employing various other structures, the distance $d_1$ between the top surface of the substrate 110 and the top surface of the end portion of the electrode power supply line 191, the portion toward an edge of the substrate 110 (+x direction), may become smaller than or equal to the distance $d_2$ between the top surface of the substrate 110 and the top surface of the portion of the interlayer insulation layer 160 corresponding to the step forming layer 193.

Figure 6:
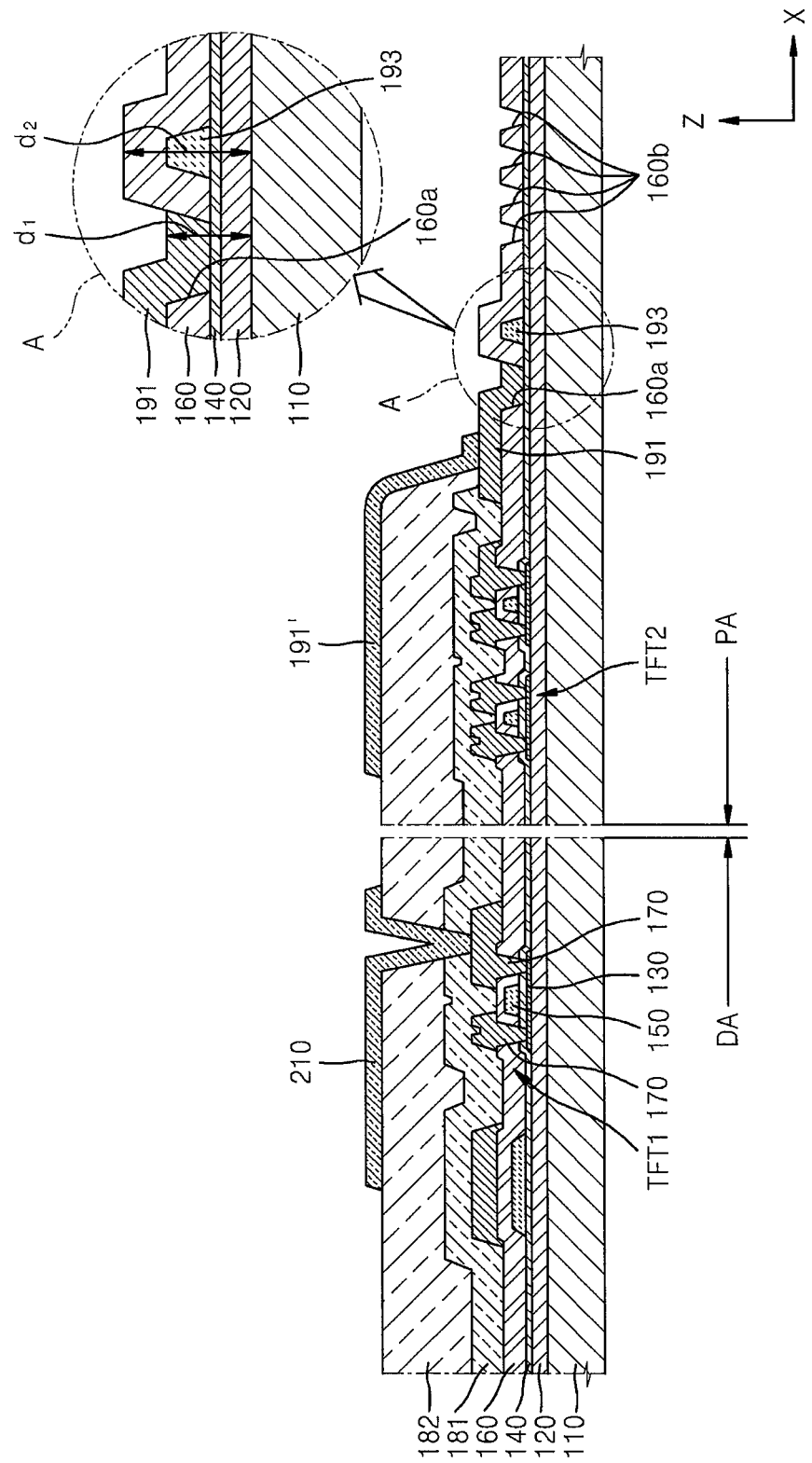
FIG. 6 is a schematic sectional view of a portion of an organic light-emitting apparatus according to another embodiment of the present invention.

FIG. 6 is a schematic sectional view of a portion of an organic light-emitting apparatus according to another embodiment of the present invention. As shown in FIG. 6, the interlayer insulation layer 160 has a groove or a hole 160a corresponding to the end portion of the electrode power supply line 191 in the peripheral area PA, and the end portion of the electrode power supply line 191 is located in the groove or the hole 160a of the interlayer insulation layer 160. Here, the end portion of the electrode power supply line 191 may be understood as one end portion of the electrode power supply line 191 in a direction toward an edge of the substrate 110, i.e., a direction (+x direction) opposite to the direction toward the display area DA. Therefore, as shown in the portion A of FIG. 1, a distance $d_1$ between the top surface of the substrate 110 and the top surface of the end portion of the electrode power supply line 191, the portion toward an edge of the substrate 110 (+x direction), may be smaller than or equal to a distance $d_2$ between the top surface of the substrate 110 and the top surface of the portion of the interlayer insulation layer 160 corresponding to the step forming layer 193. Especially, it is possible to increase the distance between the top surface of the substrate 110 and the top surface of a portion of the interlayer insulation layer 160 corresponding to the step forming layer 193, by the step forming layer 193.

As described above, as the distance $d_1$ between the top surface of the substrate 110 and the top surface of a portion of the end portion of the electrode power supply line 191, the portion toward an edge of the substrate 110 (+x direction), becomes smaller than or equal to a distance $d_2$ between the top surface of the substrate 110 and the top surface of the portion of the interlayer insulation layer 160 corresponding to the step forming layer 193, a side surface (e.g., an end side surface) of the end portion of the electrode power supply line 191 may not be exposed to the outside or, even if exposed to the outside, effects due to the exposure may be reduced or minimized.

Figure 7:
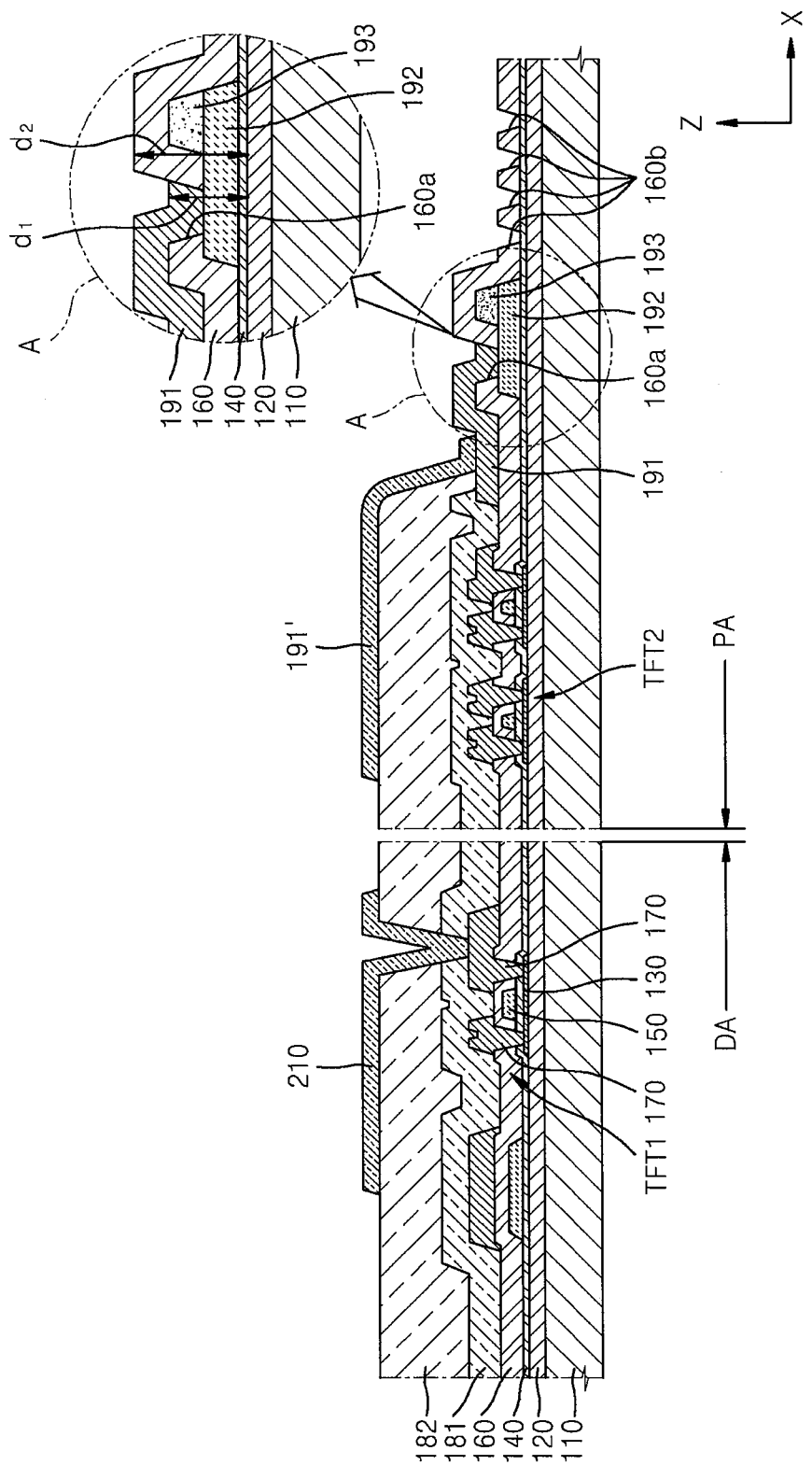
FIG. 7 is a schematic sectional view of a portion of an organic light-emitting apparatus according to another embodiment of the present invention.

FIG. 7 is a schematic sectional view of a portion of an organic light-emitting apparatus according to another embodiment of the present invention. The organic light-emitting apparatus according to the present embodiment is identical to the organic light-emitting apparatus of FIG. 6 except that the organic light-emitting apparatus according to the present embodiment further includes an additional conductive layer 192. The additional conductive layer 192 is interposed between the substrate 110 and the interlayer insulation layer 160 and is at least partially exposed by the groove (or hole) 160a of the interlayer insulation layer 160. Furthermore, the end portion of the electrode power supply line 191 is located in the groove (or hole) 160a of the interlayer insulation layer 160, and thus the electrode power supply line 191 contacts the additional conductive layer 192.

When the groove (or hole) 160a is formed by etching a particular portion of the interlayer insulation layer 160, a layer therebelow may also be etched unintentionally. Therefore, to reduce or prevent such an unintentional etching, the additional conductive layer 192 may be located below a portion of the interlayer insulation layer 160 at which the groove (or hole) 160a is to be formed. As a result, only the interlayer insulation layer 160 may be etched for precise formation of the groove (or hole) 160a. The additional conductive layer 192 may be concurrently (e.g., simultaneously) formed of the same material as the gate electrode 150 of the thin-film transistors TFT1 and TFT2.

Meanwhile, the additional conductive layer 192 may extend to below the step forming layer 193. In this case, the step forming layer 193 may be located on the additional conductive layer 192 as shown in FIG. 7. If desired, various modifications may be made therein. For example, an insulation layer may be interposed between the additional conductive layer 192 and the step forming layer 193.

Figure 8:
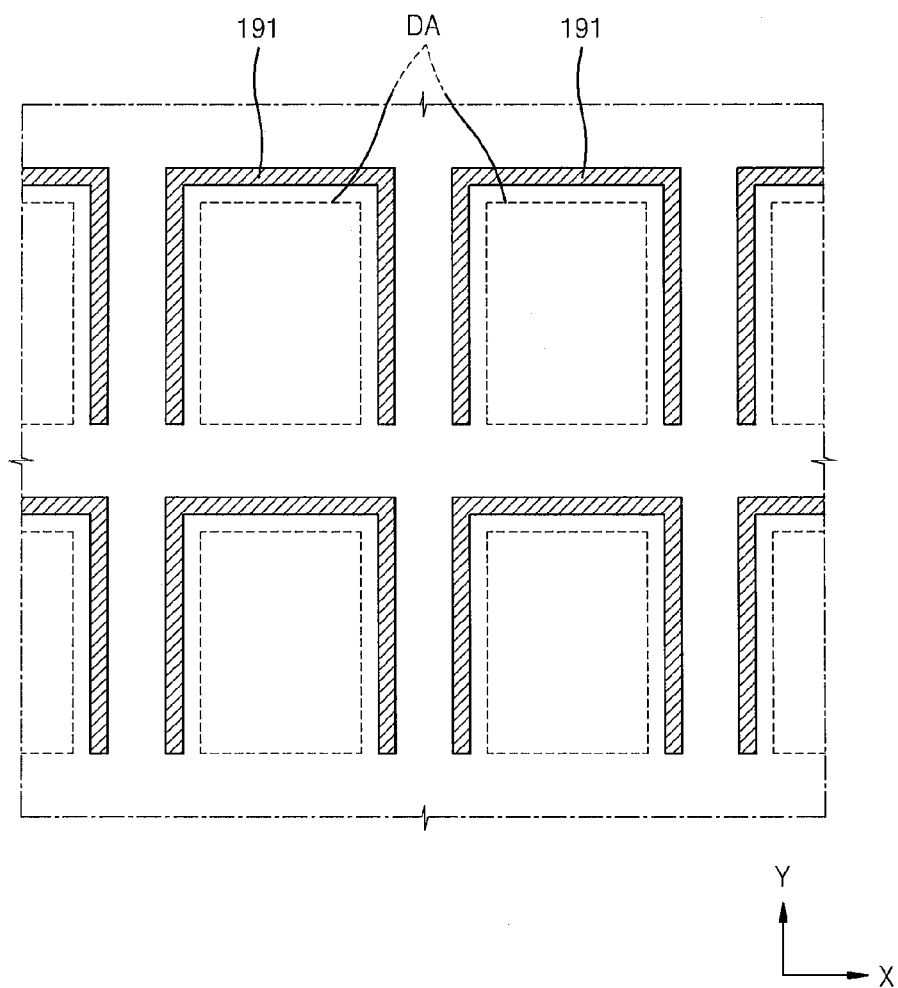
FIG. 8 is a schematic plan view showing an operation during manufacturing of an organic light-emitting apparatus according to another embodiment of the present invention.

FIG. 8 is a schematic plan view showing an operation during the manufacturing of an organic light-emitting apparatus according to another embodiment of the present invention. As shown in FIG. 8, a plurality of organic light-emitting apparatuses may be concurrently (e.g., simultaneously) manufactured by forming a plurality of display areas DA on a single large-sized mother glass. Here, the electrode power supply line 191 having a shape surrounding three out of four sides of the display area DA may be located around each of the plurality of display areas DA. Therefore, the step forming layer 193 may also have a shape extending along three out of four sides of the display area DA like the electrode power supply line 191.

In terms of a completed organic light emitting display apparatus, the step forming layer 193 may have a shape extending along an edge side of the substrate 110. If desired, the electrode power supply line 191 may also have a shape extending along an edge side of the substrate 110.

Meanwhile, as shown in FIG. 8, when each of the display areas DA has a rectangular shape including long sides and short sides, and a material for forming the pixel defining layer is applied onto the mother glass for forming the pixel defining layer, the material for forming the pixel defining layer may be applied onto a planarizing layer and an interlayer insulation layer by moving a nozzle for ejecting the material for forming the pixel defining layer in a direction from the left to the right (+x direction) in FIG. 8. Here, to smoothly apply the material for forming the pixel defining layer from a first display area DA to a second display area DA adjacent to the first display area DA to the right in the +x direction, it is desired to reduce or prevent flow of the material for forming the pixel defining layer from being interrupted by the electrode power supply lines 191 located between the first display area DA and the second display area DA.

Therefore, the step forming layer 193 may have a shape extending along a long side of the display area DA. If desired, the electrode power supply line 191 may also have a shape extending along the long side of the display area DA. Here, since a completed organic light emitting display apparatus has a rectangular shape including long sides and short sides, a long side of the display area DA may be understood as a long side of the substrate 110.

When applying the material for forming the pixel defining layer onto a mother glass shown in FIG. 8 for forming the pixel defining layer, it may be considered to apply the material for forming the pixel defining layer onto the planarizing layer and the interlayer insulation layer by moving the nozzle for ejecting the material for forming the pixel defining layer in a vertical direction (y-axis direction) instead of the direction from the left to the right (+x direction) in FIG. 8. However, in terms of increasing the number of display areas DA formed on a single mother glass for improving usability of the mother glass, it may be desired to move the nozzle for ejecting the material for forming the pixel defining layer in the direction from the left to the right of FIG. 8 (+x direction). In this case, by employing the structure as described above, defects may be prevented or effectively reduced during formation of the pixel defining layer.

If desired, the step forming layer 193 may be formed at a plurality of locations along an edge side of the substrate (in terms of a completed organic light emitting display apparatus). In this case, the electrode power supply line may have a shape extending along the edge side of the substrate. Here, the edge side may be the long side from among long sides and short sides of the substrate.

In this case, at the plurality of locations on the interlayer insulation layer 160 corresponding to the step forming layer 193, the distance $d_1$ between the top surface of the substrate 110 and the top surface of the end portion of the electrode power supply line 19, the portion toward an edge of the substrate 110 (+x direction), may be smaller than or equal to the distance $d_2$ between the top surface of the substrate 110 and the top surface of the portion of the interlayer insulation layer 160 corresponding to the step forming layer 193. Therefore, at the plurality of locations on the interlayer insulation layer 160 corresponding to the step forming layer 193, a material for forming the pixel defining layer applied onto the electrode power supply line may naturally flow from the electrode power supply line 191 onto the top surface of the interlayer insulation layer 160 in the +x direction.

Although organic light emitting display apparatuses according to embodiments of the present invention have been described above by using terms including the interlayer insulation layer 160, the gate insulation layer 140, the electrode power supply line 191, and the additional conductive layer 192, the present invention is not limited thereto. For example, the interlayer insulation layer 160 may be referred to as an insulation layer, the electrode power supply line 191 may be referred to as a first conductive layer that is located close to the portion of the insulation layer corresponding to the step forming layer 193, and the additional conductive layer 192 may be referred to as a second conductive layer interposed between the substrate 110 and the insulation layer.

As described above, according to the one or more of the above embodiments of the present invention, organic light-emitting apparatus having a structure capable of reducing defects, during the formation of an insulation layer (e.g., a pixel defining layer) may be embodied. However, the scope of the present invention is not limited thereto.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light emitting display apparatus comprising:
   a substrate having a display area and a peripheral area surrounding the display area;
   a step forming layer on the peripheral area of the substrate, the step forming layer not being a component of a thin film transistor;
   an insulation layer on the substrate and over the display area and the peripheral area, wherein a top surface of a portion of the insulation layer corresponding to the step forming layer by covering the step forming layer is higher than a top surface of a remaining portion of the insulation layer; and
   a first conductive layer on the remaining portion of the insulation layer, an end portion of the first conductive layer being close to the portion of the insulation layer corresponding to the step forming layer,
   wherein a distance between a top surface of the substrate and a top surface of the end portion of the first conductive layer is smaller than or equal to a distance between the top surface of the substrate and the top surface of the portion of the insulation layer corresponding to the step forming layer, the end portion of the first conductive layer being a portion of the first conductive layer toward an edge of the substrate.

2. The organic light emitting display apparatus of claim 1, wherein the first conductive layer has a multi-layer structure, and
   an etch rate of a material constituting a layer below a topmost layer is higher than an etch rate of a material constituting the topmost layer.

3. The organic light emitting display apparatus of claim 1, wherein the first conductive layer comprises a first titanium layer, an aluminum layer on the first titanium layer, and a second titanium layer on the aluminum layer.

4. The organic light emitting display apparatus of claim 1, wherein the distance between the top surface of the substrate and the top surface of the end portion of the first conductive layer is identical to the distance between the top surface of the substrate and the top surface of the portion of the insulation layer corresponding to the step forming layer.

5. The organic light emitting display apparatus of claim 1, wherein a thickness of the step forming layer is equal to or greater than a thickness of the first conductive layer.

6. An organic light emitting display apparatus comprising:
   a substrate having a display area and a peripheral area surrounding the display area;
   a step forming layer on the peripheral area of the substrate, the step forming layer not being a component of a thin film transistor;
   an insulation layer on the substrate and over the display area and the peripheral area, wherein a top surface of a portion of the insulation layer corresponding to the step forming layer by covering the step forming layer is higher than a top surface of a remaining portion of the insulation layer; and
   a first conductive layer on the remaining portion of the insulation layer, an end portion of the first conductive layer being close to the portion of the insulation layer corresponding to the step forming layer, wherein the step forming layer comprises a first step forming layer and a second step forming layer.

7. The organic light emitting display apparatus of claim 1, wherein a side surface of the end portion of the first conductive layer facing toward the step forming layer contacts a side surface of the portion of the insulation layer corresponding to the step forming layer.

8. The organic light emitting display apparatus of claim 1, wherein the insulation layer comprises a groove or a hole corresponding to the end portion of the first conductive layer, and
the end portion of the first conductive layer is located in the groove or the hole of the insulation layer.

9. The organic light emitting display apparatus of claim 8, further comprising a second conductive layer between the substrate and the insulation layer and at least partially exposed by the groove or the hole of the insulation layer,
wherein the end portion of the first conductive layer contacts the second conductive layer.

10. The organic light emitting display apparatus of claim 9, wherein the second conductive layer extends to below the step forming layer.

11. The organic light emitting display apparatus of claim 1, wherein the step forming layer has a shape extending along an edge side of the substrate, and
the first conductive layer also has a shape extending along the edge side of the substrate.

12. The organic light emitting display apparatus of claim 11, wherein the substrate has a rectangular shape having long sides and short sides, and
the edge side of the substrate is the long side.

13. An organic light emitting display apparatus comprising:
a substrate having a display area and a peripheral area surrounding the display area;
a step forming layer on the peripheral area of the substrate, the step forming layer not being a component of a thin film transistor;
an insulation layer on the substrate and over the display area and the peripheral area, wherein a top surface of a portion of the insulation layer corresponding to the step forming layer by covering the step forming layer is higher than a top surface of a remaining portion of the insulation layer; and
a first conductive layer on the remaining portion of the insulation layer, an end portion of the first conductive layer being close to the portion of the insulation layer corresponding to the step forming layer, wherein the step forming layer is formed at a plurality of locations along an edge side of the substrate, and
the first conductive layer has a shape extending along the edge side of the substrate.

14. The organic light emitting display apparatus of claim 13, wherein the substrate has a rectangular shape having long sides and short sides, and
the edge side of the substrate is the long side.

15. The organic light emitting display apparatus of claim 7, wherein a top surface of the end portion of the first conductive layer and the top surface of the portion of the insulation layer corresponding to the step forming layer form a substantially flat surface.

16. The organic light emitting display apparatus of claim 1, wherein the end portion of the first conductive layer is a part of the first conductive layer in a direction opposite to the display area.

17. The organic light emitting display apparatus of claim 1, wherein the end portion of the first conductive layer is positioned between the step forming layer and the display area.

18. The organic light emitting display apparatus of claim 1, further comprising a protection layer partially covering the first conductive layer other than the end portion of the first conductive layer.

19. The organic light emitting display apparatus of claim 1, wherein the end portion of the first conductive layer laterally faces the portion of the insulation layer corresponding to the step forming layer.

* * * * *